United States Patent [19]
Hashizumi et al.

[11] Patent Number: 5,289,419
[45] Date of Patent: Feb. 22, 1994

[54] STATIC RANDOM ACCESS MEMORY DEVICE WITH HIGH SPEED DIFFERENTIAL AMPLIFIER COUPLED WITH DIGIT LINE PAIR THROUGH CAPACITORS

[75] Inventors: Toshihiro Hashizumi; Mitsuhiro Koyanagi, both of Kanagawa, Japan

[73] Assignee: NEC Corporation, Tokyo, Japan

[21] Appl. No.: 858,600

[22] Filed: Mar. 27, 1992

[30] Foreign Application Priority Data

Mar. 27, 1991 [JP] Japan ................. 3-62253

[51] Int. Cl.$^5$ .............................. G11C 7/00
[52] U.S. Cl. ........................ 365/203; 365/207; 365/190
[58] Field of Search ............. 365/203, 207, 190; 307/530

[56] References Cited
U.S. PATENT DOCUMENTS 5,001,668 3/1991 Ito et al. ................. 365/203
5,032,744 7/1991 Wai Yeung Liu ............. 307/530
5,051,952 9/1991 Gotou ..................... 365/190

FOREIGN PATENT DOCUMENTS 0332135 9/1989 European Pat. Off. ........ 365/203

Primary Examiner—Eugene R. LaRoche
Assistant Examiner—Andrew Tran
Attorney, Agent, or Firm—Sughrue, Mion, Zinn, Macpeak & Seas

[57] ABSTRACT

A static type random access memory device is equipped with sense amplifier circuits for rapidly developing small differential voltage levels respectively indicative of data bits read out from selected memory cells to digit line pairs, and the input nodes of each sense amplifier circuit are coupled with the associated digit line pair through a pair of capacitors, wherein the digit line pairs and the input nodes are respectively precharged to a high voltage level and an intermediate voltage level so that the sense amplifier circuits start on developing immediately after activation thereof.

7 Claims, 5 Drawing Sheets

STATIC RANDOM ACCESS MEMORY DEVICE WITH HIGH SPEED DIFFERENTIAL AMPLIFIER COUPLED WITH DIGIT LINE PAIR THROUGH CAPACITORS

FIELD OF THE INVENTION

This invention relates to a static random access memory device and, more particularly, to a differential amplifier circuit for developing a differential voltage on an associated digit line pair.

DESCRIPTION OF THE RELATED ART

A typical example of the static type random access memory device is illustrated in FIG. 1, and largely comprises a memory cell array 1, a primary precharging circuit 2, a secondary precharging circuit 3 and a sense amplifier circuit array 4. Although various peripheral circuits such as row and column address circuits are further incorporated in the static random access memory device, they are omitted from FIG. 1, because they are less important in view of understanding the present invention.

The memory cell array 1 is implemented by a plurality of memory cells MC1 to MCn arranged in matrix, and each memory cell MC1, . . . or MCn comprises a loop of inverters LP and a pair of n-channel enhancement type transfer transistors TR1 and TR2 coupled with memory nodes N1 and N2 of the loop of inverters LP. The loop of the inverters LP stores a data bit in the form of a differential voltage level at the memory nodes N1 and N2 thereof.

The columns of the memory cell array 1 are respectively associated with a plurality of digit line pairs DL1 to DLn, and each of the digit line pairs DL1 to DLn consists of two digit lines DLa and DLb. The pair of digit lines DLa and DLb are respectively connectable through the n-channel enhancement type transfer transistors TR1 and TR2 with the memory nodes N1 and N2 of the memory cells of the associated column of the memory cell array 1.

In order to select a memory cell from each of the columns, word lines are coupled with the rows of the memory cell array 1, and only one of the word lines is shown and labeled with WL. The word line WL is coupled with the gate electrodes of the n-channel enhancement type transfer transistors TR1 and TR2 of the associated row of the memory cell array 1, and is driven to a positive high voltage level. With the positive high voltage level, all of the n-channel enhancement type transfer transistors TR1 and TR2 coupled therewith concurrently turn on, and the data bits are respectively read out from the loops of inverters LP to the associated digit line pairs DL1 to DLn.

The primary precharging circuit 2 is implemented by a plurality of precharging units 21 to 2n or pairs of p-channel enhancement type precharging transistors TR3 and TR4 associated with the digit line pairs DL1 to DLn, and the p-channel enhancement type precharging transistors TR3 and TR4 are concurrently responsive to a precharging signal PCH at a control node N3 for interconnecting a positive power voltage line Vdd and all the digit line pairs DL1 to DLn.

The secondary precharging circuit 3 is implemented by a plurality of precharging units 31 to 3n, and each of the precharging units 31 to 3n comprises a pair of p-channel enhancement type precharging transistors TR5 and TR6 coupled between the positive power voltage line vdd and the digit lines DLa and DLb of the associated digit line pair, and a p-channel enhancement type balancing transistor TR7 coupled between the digit lines DLa and DLb of the associated digit line pair.

The sense amplifier circuit array 4 is implemented by a plurality of sense amplifier circuits 41 to 4n respectively associated with the digit line pairs DL1 to DLn, and each of the sense amplifier circuits 41 to 4n comprises a first series combination of a p-channel enhancement type field effect transistor TR8 and an n-channel enhancement type field effect transistor TR9 coupled between the power voltage line Vdd and a common node N4, a second series combination of a p-channel enhancement type field effect transistor TR10 and an n-channel enhancement type field effect transistor TR11 coupled in parallel to the first series combination, and an n-channel enhancement type activation transistor TR12 coupled between the common node N4 and a ground voltage line GND. Both of the p-channel enhancement type field effect transistors TR8 and TR10 are coupled with the common drain node N5 of the first series combination, and the n-channel enhancement type field effect transistors TR9 and TR11 are respectively gated by the digit lines DLa and DLb of the associated digit line pair. The n-channel enhancement type activation transistor TR12 is responsive to a selecting signal SE, and the common node N4 is grounded upon elevation of the selecting signal SE to a positive high voltage level. Then, the n-channel enhancement type field effect transistors TR9 and TR11 develop the differential voltage level indicative of a data bit, and a large differential voltage level also indicative of the data bit takes place between the common drain nodes N5 and N6. The data bit at the common drain node N6 is transferred to a data output circuit OUT.

FIG. 2 shows the waveforms of voltage levels on essential lines and nodes, and the static type random access memory device thus arranged behaves as follows. Assuming now that an address signal specifies the memory cell MC1 storing a data bit indicated by a low voltage level at the memory node N1 as well as by a high voltage level at the memory node N2, the precharging signal PCH goes down to a low voltage level or the ground voltage level at time t1, and both primary and secondary precharging circuits 2 and 3 couple the positive power voltage line Vdd to all of the digit line pairs DL1 to DLn. Namely, all of the p-channel enhancement-type precharging transistors TR3, TR4, TR5 and TR6 and the p-channel enhancement type balancing transistor TR7 simultaneously turn on, and the positive power voltage line Vdd precharge the digit lines DLa and DLb of all the digit line pairs DL1 to DLn as well as the input nodes N7 and N8 of the sense amplifier circuits 41 to 4n. Then, the digit lines DLa and DLb and the associated input nodes N7 and N8 start on increasing toward the positive power voltage level Vdd.

After reaching the positive power voltage level Vdd, the precharging signal PCH is recovered to the high voltage level at time t2, and the word line WL goes up to the positive high voltage level. The word line WL allows the n-channel enhancement type transfer transistors TR1 and TR2 of all the memory cells MC1 to MCn to turn on, and the data bits stored in the memory cells MC1 to MCn are read out to the associated digit line pairs DL1 to DLn, respectively. Small differential voltage levels take place on the respective digit line pairs DL1 to DLn, and the data bit in the memory cell MC1 causes the digit line DLa to slowly go down. However, the digit line DLb is kept in the positive power voltage level Vdd. If no sense amplifier circuit is provided in association with the digit line pairs DL1 to DLn, the component transistors of the loop LP is so small in size and, accordingly, in current driving capability that the digit line DLa goes down at extremely low speed due to large parasitic capacitance coupled with the digit line DLa as well as with the input node N7.

The selecting signal SE is lifted to the high voltage level at time t2, and the sense amplifier circuit 41 is activated so as to develop the small differential voltage on the associated digit line pair DL1. The n-channel enhancement type field effect transistor TR9 gradually decreases the channel conductance thereof together with the voltage level on the digit line DLa, and the n-channel enhancement type field effect transistor TR9 cuts the common drain node N5 from the ground voltage line GND. The voltage level at the common drain node N5 is rapidly increased, and the p-channel enhancement type field effect transistors TR8 and TR10 also rapidly turn off.

On the other hand the digit line DLb at the positive power voltage level Vdd allows the n-channel enhancement type field effect transistor TR11 to be turned on, and the common drain node N6 is grounded through the n-channel enhancement type field effect transistor TR11 and the n-channel enhancement type activation transistor TR12. The common drain node N6 is rapidly decayed, and the voltage level thus rapidly decayed is supplied to the data output circuit OUT for producing an output data signal.

However, a problem is encountered in the prior art static type random access memory device in that relatively long time period is consumed from the precharging operation to the production of the output data signal. This is because of the fact that the sense amplifier circuit actually starts on developing the differential voltage level when one of the digit lines reaches around a half of the positive power voltage level Vdd/2 at time t3. As described hereinbefore, the component transistor of the loop LP is expected to discharge not only the parasitic capacitance coupled with the digit line but also the parasitic capacitance coupled with the associated input node of the sense amplifier circuit, and the component transistor with small current driving capability consumes prolonged time period. In fact, the prior art static type random access memory device consumes tens to hundreds nanoseconds for reading out a data bit.

SUMMARY OF THE INVENTION

It is therefore an important object of the present invention provide a static type random access memory device which allows an external device to access a data bit stored therein at improved speed.

To accomplish the object, the present invention proposes to couple a pair of capacitors between a pair of digit lines and input nodes of an sense amplifier circuit.

In accordance with the present invention, there is provided a static type random access memory device fabricated on a single semiconductor chip, comprising: a) a plurality of memory cells arranged in rows and columns, and respectively storing data bits each in the form of a differential voltage level; b) a plurality of digit line pairs respectively associated with the columns of the plurality of memory cells, and operative to propagate differential voltage levels respectively indicative of data bits; c) a plurality of word lines respectively associated with the rows of the plurality of memory cells, and selectively driven to an active level for coupling the plurality of digit lines with the memory cells coupled therewith; d) a plurality of sense amplifier circuits respectively associated with the plurality of digit line pairs, and each responsive to the differential voltage level on the associated digit line pair so as to rapidly develop a differential voltage level indicative of one of the data bits on the associated digit line pair between internal nodes provided therein; e) a precharging circuit coupled with the plurality of digit line pairs for precharging to one of high and low voltage levels; f) a plurality of coupling means capacitively coupled between the digit line pairs and pairs of input nodes of the plurality of sense amplifier circuits; and g) an intermediate voltage producing means coupled with the pair of internal nodes of each sense amplifier circuit for precharging to an intermediate voltage level between the high and low voltage levels.

BRIEF DESCRIPTION OF THE DRAWINGS

The feature and advantages of the static type random access memory device according to the present invention will be more clearly understood from the following description taken in conjunction with the accompanying drawings in which.

DESCRIPTION OF THE PREFERRED EMBODIMENTS

First Embodiment

Figure 1:
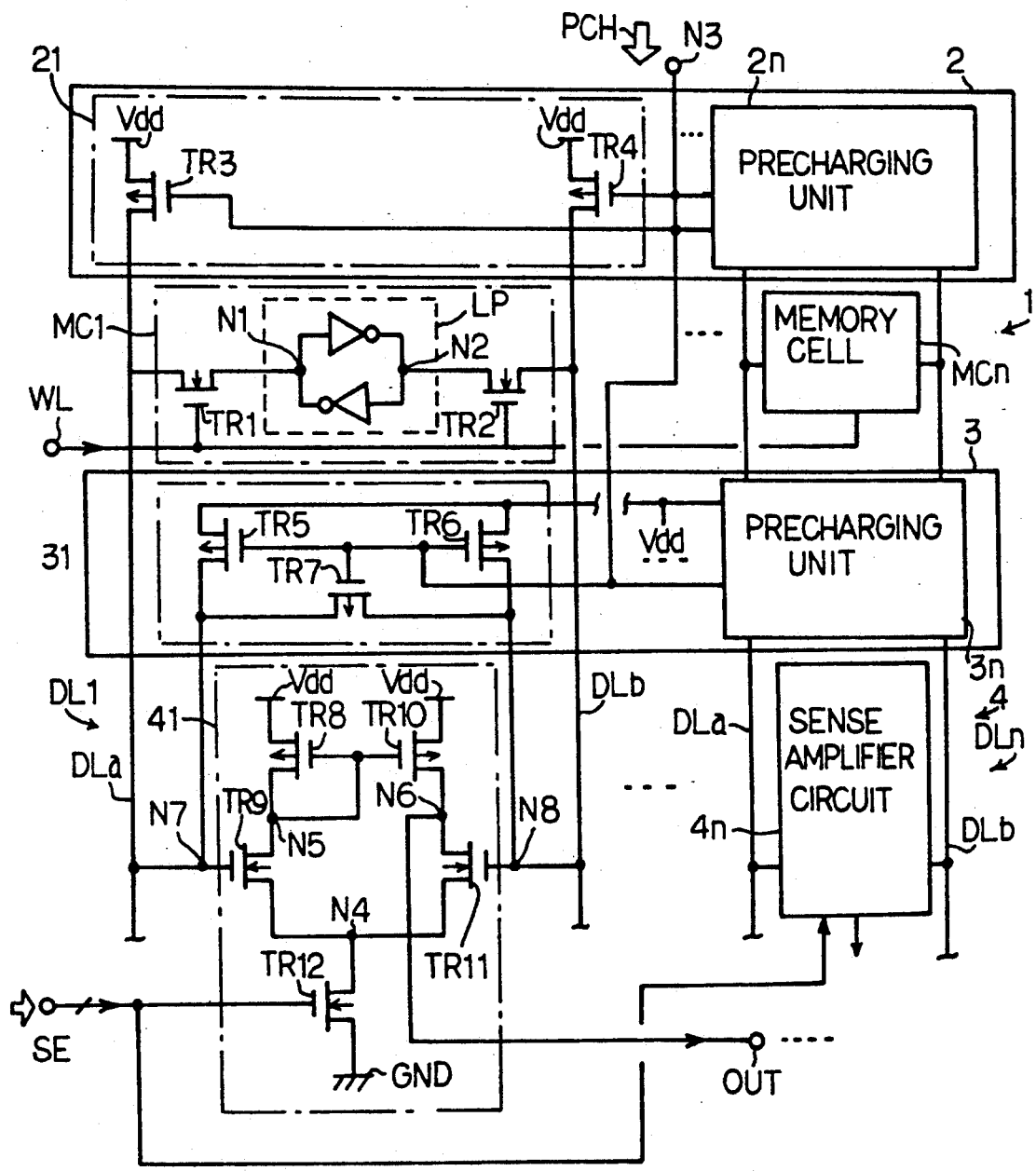
FIG. 1 is a circuit diagram showing the arrangement of the prior art static type random access memory device.
Figure 2:
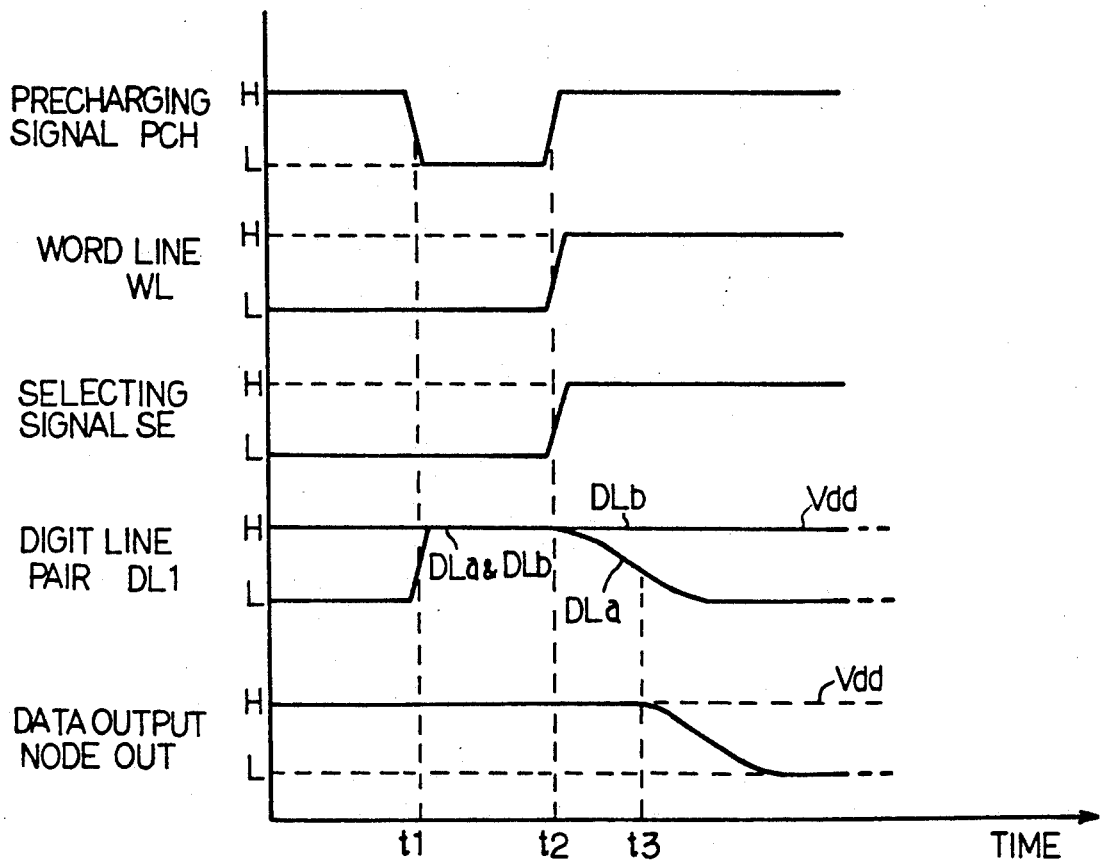
FIG. 2 is a timing chart showing the circuit behavior of the prior art static type random access memory device.
Figure 3:
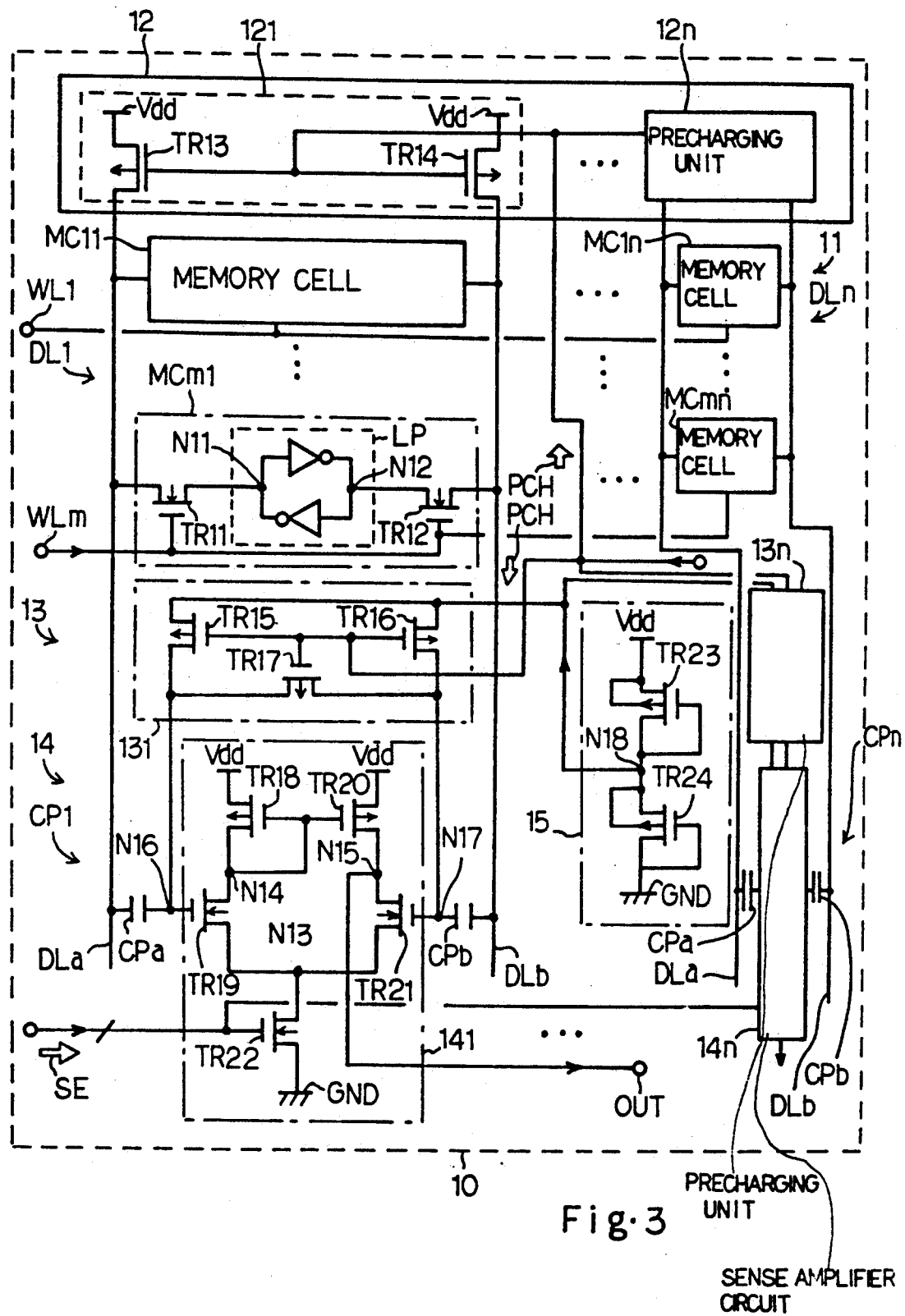
FIG. 3 is a circuit diagram showing the arrangement of a static type random access memory device according to the present invention.

Referring first to FIG. 3 of the drawings, a static type random access memory device embodying the present invention is fabricated on a single semiconductor chip 10, and largely comprises a memory cell array 11, a primary precharging circuit 12, a secondary precharging circuit 13, a sense amplifier circuit array 14, and an intermediate voltage producing circuit 15. Although various peripheral circuits such as row and column address circuits are further incorporated in the static random access memory device, they are omitted from FIG. 3 as similar to the illustration of the prior art static type random access memory device.

The memory cell array 1 is implemented by a plurality of memory cells MC11, MC1n, MCm1 and MCmn arranged in rows and columns, and each memory cell MC11, MC1n, MCm1 or MCmn comprises a loop of inverters LP and a pair of n-channel enhancement type transfer transistors TR11 and TR12 coupled with memory nodes N11 and N12 in the loop of inverters LP. The loop of the inverters LP stores a data bit in the form of a differential voltage level at the memory nodes N11 and N12 thereof.

The columns of the memory cell array 11 are respectively associated with a plurality of digit line pairs DL1 to DLn, and each of the digit line pairs DL1 to DLn consists of two digit lines DLa and DLb. The pair of digit lines DLa and DLb are respectively connectable through the n-channel enhancement type transfer transistors TR11 and TR12 with the memory nodes N11 and N12 of the memory cells of the associated column of the memory cell array 11.

A plurality of word lines WL1 to WLm are coupled with the rows of the memory cell array 1, respectively, and only one of the word lines is driven to a high voltage level. The word lines WL1 to WLm are coupled with the gate electrodes of the n-channel enhancement type transfer transistors TR11 and TR12 of the associated rows of the memory cell array 11, and all of the n-channel enhancement type transfer transistors TR11 and TR12 coupled thereto simultaneously turn on so as to couple the memory nodes N11 and N12 with the associated digit line pairs DL1 to DLn. When all of the n-channel enhancement type transfer transistors TR11 and TR12 coupled with the word line driven to the high voltage level concurrently turn on, the data bits are respectively read out from the loops of inverters LP to the associated digit line pairs DL1 to DLn.

The primary precharging circuit 12 is implemented by a plurality of precharging units 121 to 12n or pairs of p-channel enhancement type precharging transistors TR13 and TR14 associated with the digit line pairs DL1 to DLn, and the p-channel enhancement type precharging transistors TR13 and TR14 are concurrently responsive to a precharging signal PCH for interconnecting a positive power voltage line Vdd and all the digit line pairs DL1 to DLn.

The secondary precharging circuit 13 is implemented by a plurality of precharging units 131 to 13n, and each of the precharging units 131 to 13n comprises a pair of p-channel enhancement type precharging transistors TR15 and TR16 coupled between the output node of the intermediate producing circuit 15 and the digit lines DLa and DLb of the associated digit line pair, and a p-channel enhancement type balancing transistor TR17 coupled between the digit lines DLa and DLb of the associated digit line pair.

The sense amplifier circuit array 14 is implemented by a plurality of sense respectively associated with the digit line pairs DL1 to DLn, and each of the sense amplifier circuits 141 to 14n comprises a first series combination of a p-channel enhancement type field effect transistor TR18 and an n-channel enhancement type field effect transistor TR19 coupled between the positive power voltage line Vdd and a common node N13, a second series combination of a p-channel enhancement type field effect transistor TR20 and an n-channel enhancement type field effect transistor TR21 coupled in parallel to the first series combination, and an n-channel enhancement type activation transistor TR22 coupled between the common node N13 and a ground voltage line GND. Both of the p-channel enhancement type field effect transistors TR18 and TR20 are coupled with the common drain node N14 of the first series combination, and the n-channel enhancement type field effect transistors TR19 and TR21 are respectively gated by input nodes N16 and N17. The n-channel enhancement type activation transistor TR22 is responsive to a selecting signal SE, and the common node N13 is grounded upon elevation of the selecting signal SE to a positive high voltage level. When the associated activation signal SE goes up to the high voltage level, the n-channel enhancement type activation transistor TR22 turns on to ground the common node N13, and the sense amplifier circuit thus activated causes a differential voltage level between the common drain node N14 and N15. Therefore, the common drain nodes N14 and N15 serve as internal nodes. The common drain node N15 is coupled with an data buffer circuit OUT, and the voltage level at the common drain node N15 is indicative of a data bit read out from or written into one of the memory cells MC11 to MCmn.

A plurality pairs of capacitors CP1 to CPn are respectively associated with the digit line pairs DL1 to DLn and the input nodes N16 and N17 of the associated sense amplifier circuits 141 to 14n, and, accordingly, the digit line pairs DL1 to DLn are capacitively coupled with the input nodes N16 and N17 of the associated sense amplifier circuits 141 to 14n, respectively. The component capacitors of each pair are respectively labeled with CPa and CPb. Therefore, the pairs of capacitors CP1 to CPn as a while constitute a plurality of coupling means.

The intermediate voltage producing circuit 15 is implemented by a series combination of two p-channel enhancement type load transistors TR23 and TR24 coupled between the positive power voltage line Vdd and the ground voltage line GND. The gate electrode of the p-channel enhancement type load transistor TR23 is coupled with an output node N18 of the intermediate voltage producing circuit 15 between the load transistors TR23 and TR24, and the gate electrode of the p-channel enhancement type load transistor TR24 is grounded. The series combination of p-channel enhancement type load transistors TR23 and TR24 thus arranged produces an intermediate voltage level Vdd/2 as large as half of the positive power voltage level Vdd at the output node N18.

Figure 4:
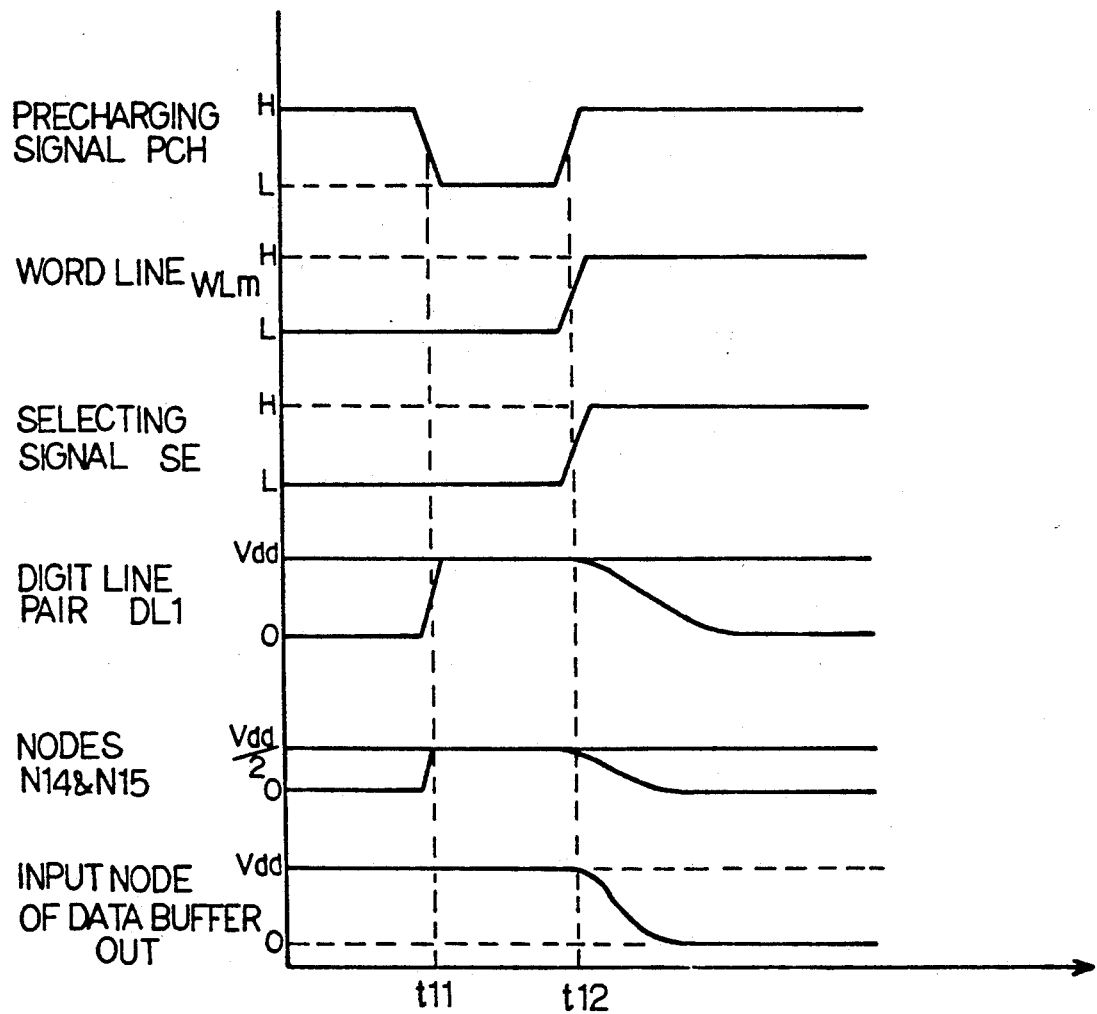
FIG. 4 is a timing chart showing the circuit behavior of the static type random access memory device shown in FIG. 3.

Description is hereinbelow made on circuit behavior of the static type random access memory device with reference to FIG. 4. Assuming now that an address signal specifies the memory cell MCm1 storing a data bit indicated by a low voltage level at the memory node N11 as well as by a high voltage level at the memory node N12, the precharging signal PCH goes down to a low voltage level or the ground voltage level at time t11, and both primary and secondary precharging circuits 12 and 13 become operative. All of the p-channel enhancement-type precharging transistors TR13, TR14, TR15 and TR16 and the p-channel enhancement type balancing transistor TR17 simultaneously turn on, and the digit line pairs DL1 to DLn and the input nodes N16 and N17 are precharged to different voltage levels. Namely, the primary precharging circuit 12 couples the positive power voltage line Vdd to all of the digit line pairs DL1 to DLn, and the secondary precharging circuit 13 couples the input nodes N16 and N17 of the associated sense amplifier circuits 141 to 14n with the output node N18 of the intermediate voltage producing circuit 15.

After reaching the positive power voltage level Vdd and the intermediate voltage level Vdd/2, the precharging signal PCH is recovered to the high voltage level at time t12, and the word line WLm goes up to the positive high voltage level. The word line WLm allows the n-channel enhancement type transfer transistors TR11 and TR12 of all the memory cells MCm1 to MCmn to turn on, and the data bits stored in the memory cells MCm1 to MCmn are read out to the associated digit line pairs DL1 to DLn, respectively. Small differential voltage levels take place on the respective digit line pairs DL1 to DLn, and the data bit in the memory cell MCm1 causes the digit line DLa to be slightly decreased. However, the digit line DLb of the digit line pair DL1 is kept in the positive power voltage level Vdd.

The selecting signal SE is lifted to the high voltage level at time t12, and the sense amplifier circuit 141 is activated so as to produce a differential voltage level on the common drain nodes N14 and N15 depending upon the differential voltage level on the associated digit line pair DL1. Since the input nodes N16 and N17 have been already precharged to the intermediate voltage level Vdd/2, differential voltage level of about Vdd/2 is applied across the component capacitors CPa and CPb, and the sense amplifier circuit 141 immediately starts on producing the differential voltage level between the common drain nodes N14 and N15 upon production of the slight variation in voltage level on the digit line DLa due to the data bit stored in the memory cell MCm1. The gain of each n-channel enhancement type field effect transistor TR19 or TR21 is usually the maximum, and the differential voltage level between the common drain nodes N14 and N15 are rapidly developed. Namely, the n-channel enhancement type field effect transistor TR19 rapidly decreases the channel conductance thereof, and the n-channel enhancement type field effect transistor TR19 cuts the common drain node N14 from the ground voltage line GND. The voltage level at the common drain node N14 is rapidly increased, and the p-channel enhancement type field effect transistors TR18 and TR20 also rapidly turn off. Since the digit line DLb at the positive power voltage level Vdd allows the n-channel enhancement type field effect transistor TR21 to be turned on, and the common drain node N15 is grounded through the n-channel enhancement type field effect transistor TR21 and the n-channel enhancement type activation transistor TR22. The common drain node N15 is rapidly decayed, and the voltage level thus rapidly decayed is supplied to the data buffer circuit OUT for producing an output data signal.

As will be understood from the foregoing description, half of the positive power voltage level Vdd/2 has already taken place between the digit lines DL1 and DLb and the input nodes N16 and N17, and slight variation in voltage level allows the associated sense amplifier circuit to immediately start on producing differential voltage level between the common drain nodes N14 and N15 with the maximum gain. Therefore, the data bit is rapidly read out from one of the memory cells M11 to Mmn, and the read-out operation consumes only several nanosecond.

Second Embodiment

Figure 5:
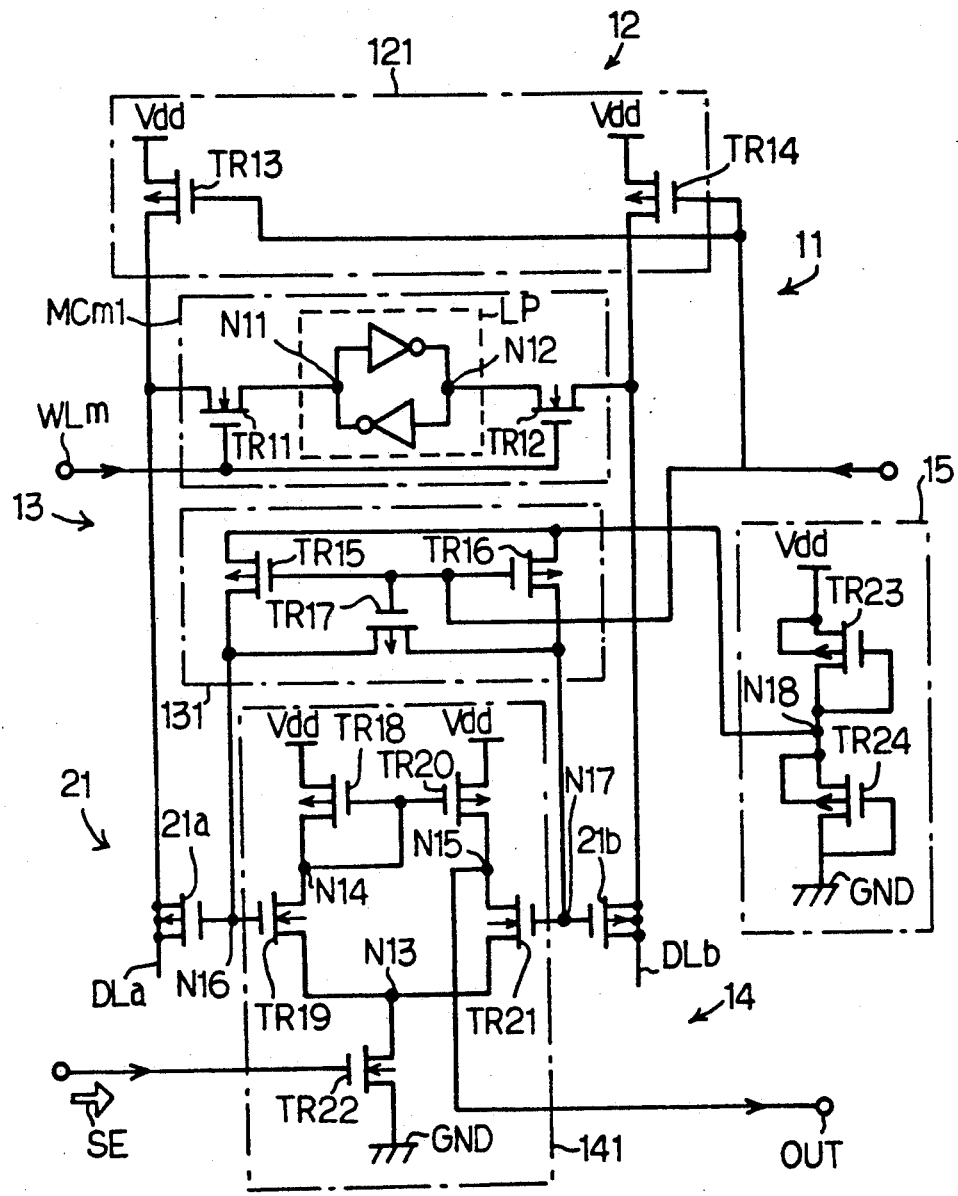
FIG. 5 is a circuit diagram showing the arrangement of another static type random access memory device according to the present invention.

Turning to FIG. 5 of the drawings, anther static type random access memory device is illustrated, and the static type random access memory device implementing the second embodiment is similar to the first embodiment except for coupling means 21. The other circuit components are labeled with the same references designating the corresponding circuit components of the first embodiment. The coupling means 21 has a pair of field effect transistors 21a and 21b, the source and drain of each field effect transistor 21a or 21b are coupled with each other for forming a capacitor electrode. The other electrode is implemented by the gate electrode of each field effect transistor 21a or 21b. Since a capacitor coupled between a digit line and an input node of a sense amplifier circuit is expected to have capacitance of about 0.1 pF, the field effect transistor 21a or 21b thus coupled can provide sufficient capacitance, and the occupation area of the coupling means is effectively reduced.

The circuit behavior of the static type random access memory device implementing the second embodiment is similar to that of the first embodiment, and no further description is incorporated hereinbelow for avoiding repetition.

Although particular embodiments of the present invention have been shown and described, it will be obvious to those skilled in the art that various changes and modifications may be made without departing from the spirit and scope of the present invention. For example, any capacitive coupling is available for the coupling means, and p-channel enhancement type field effect transistors may be exchanged with n-channel enhancement type field effect transistors.

What is claimed is:

1. A static type random access memory device fabricated on a single semiconductor chip, comprising:
   a) a plurality of memory cells arranged in rows and columns, and respectively storing data bits each in the form of a differential voltage level;
   b) a plurality of digit line pairs respectively associated with the columns of said plurality of memory cells, and operative to propagate differential voltage levels respectively indicative of data bits;
   c) a plurality of word lines respectively associated with the rows of said plurality of memory cells, and selectively driven to an active level for coupling said plurality of digital lines with the memory cells associated therewith;
   d) a plurality of sense amplifier circuits respectively associated with said plurality of digit line pairs, and each responsive to the differential voltage level on the associated digit line pair so as to rapidly develop a differential voltage level indicative of one of the data bits on the associated digit line pair between a pair of internal nodes provided therein;
   e) a precharging circuit coupled with said plurality of digit line pairs for precharging said plurality of digit line pairs to one of high and low voltage levels;
   f) a plurality of coupling means capacitively coupled between said plurality of digit line pairs and pairs of input nodes of said plurality of sense amplifier circuits; and
   g) an intermediate voltage producing means coupled with said pair of internal nodes of each sense amplifier circuit for precharging said pair of internal nodes to an intermediate voltage level between said high and low voltage levels.

2. A static type random access memory device as set forth in claim 1, in which each of said plurality of memory cells comprises a first inverter having an input node and an output node, a second inverter having an input node and an output node respectively coupled with the output node and the input node of said first inverter, a first transfer transistor coupled between one of component digit lines of the associated digit line pair and the output node of said second inverter, and a second transfer transistor coupled between the other component digit line of said associated digit line pair and the output rode Of said first inverter said first and second transfer transistors being gated by the associated word line.

3. A static type random access memory device as set forth in claim 1, in which each of said plurality of sense amplifier circuits comprises a first series combination of a first field effect transistor of a first channel conductivity type and a second field effect transistor of a second channel conductivity type opposite to said first channel conductivity type coupled between said intermediate voltage producing means and a common node, a second series combination of a third field effect transistor of said first channel conductivity type and a fourth field effect transistor of said second channel conductivity type coupled between said intermediate voltage producing means and said common node, and a fifth field effect transistor of said second channel conductivity type responsive to a selecting signal and coupled between said common node and a constant voltage source, gate electrodes of said first and third field effect transistors being coupled with one of said pair of internal nodes between said first and second field effect transistors, said second and forth field effect transistors being respectively coupled with the associated pair of input nodes, the other of said pair of internal nodes serving as an output node of said each of said plurality of sense amplifier circuits, said constant voltage source producing said low voltage level.

4. A static type random access memory device as set forth in claim 3, in which said second and fourth field effect transistors are maximized in gain around said intermediate voltage level.

5. A static type random access memory device as set forth in claim 3, in which said precharging circuit comprises a plurality of precharging units respectively associated with said plurality of digit line pairs, each of said precharging units having a sixth field effect transistor of said first channel conductivity type and a seventh field effect transistor of said first channel conductivity type respectively coupled between a source of power voltage level and the associated digit line pair, said sixth and seventh field effect transistors being gated with a precharging signal, said source of power voltage level producing said high voltage level.

6. A static type random access memory device as set forth in claim 1, in which each of said plurality of coupling means has a first capacitor coupled between one of component digit lines of the associated digit line pair and one of the pair of input nodes of the associated sense amplifier circuit, and a second capacitor coupled between the other component digit line and the other of said pair of input nodes.

7. A static type random access memory device as set forth in claim 1, in which each of said plurality of coupling means has an eighth field effect transistor having source and drain nodes coupled with one of component digit lines of the associated digit line pair and a gate electrode coupled with one of the pair of input nodes of the associated sense amplifier circuit, and a ninth field effect transistor having source and drain nodes both coupled with the other component digit line and a gate electrode coupled with the other of said pair of input nodes.

* * * * *

UNITED STATES PATENT AND TRADEMARK OFFICE
CERTIFICATE OF CORRECTION

PATENT NO. : 5,289,419

DATED : February 22, 1994

INVENTOR(S) : Toshihiro Hashizumi and Mitsuhiro Koyanagi

It is certified that error appears in the above-identified patent and that said Letters Patent is hereby corrected as shown below:

Column 5, line 48, after "sense", insert --amplifier circuits 141 to 14n--;

Column 9, line 1, delete "Of", and insert --of--.

Signed and Sealed this

Twenty-sixth Day of July, 1994

Attest:

BRUCE LEHMAN

Attesting Officer

Commissioner of Patents and Trademarks